United States Patent
Dunwoody (10) Patent No.: US 9,209,572 B1
(45) Date of Patent: Dec. 8, 2015

(54) PLUGGABLE CONNECTOR CONFIGURED TO REDUCE ELECTROMAGNETIC INTERFERENCE LEAKAGE

(71) Applicant: Tyco Electronics Corporation, Berwyn, PA (US)

(72) Inventor: Steven David Dunwoody, Middletown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 14/444,738

(22) Filed: Jul. 28, 2014

(51) Int. Cl.
*H01R 13/6581* (2011.01)

(52) U.S. Cl.
CPC .................................. *H01R 13/6581* (2013.01)

(58) Field of Classification Search
CPC ..................... H01R 13/6581; H01R 13/65802; H01R 13/6873
USPC ............ 439/827, 825, 607.41, 607.17, 607.2, 439/607.19
See application file for complete search history.

(56) References Cited

U.S. PATENT DOCUMENTS

| | | | |
|---|---|---|---|
| 7,438,596 B2 | 10/2008 | Phillips | |
| 7,455,554 B2 | 11/2008 | Long | |
| 7,729,130 B1 | 6/2010 | Bianchini | |
| 2007/0117458 A1 | 5/2007 | Winker et al. | |
| 2008/0205895 A1* | 8/2008 | Moore | 398/135 |

\* cited by examiner

*Primary Examiner* — Tulsidas C Patel
*Assistant Examiner* — Marcus Harcum (57) ABSTRACT

Pluggable connector including a mating plug that extends along a central axis. The mating plug is configured to be inserted into a receiving cavity of a communication system. The pluggable connector also includes an electromagnetic interference (EMI) skirt that is coupled to the mating plug. The EMI skirt has a skirt wall that extends alongside an exterior surface of the mating plug. The skirt wall has a wall edge portion and a spring beam that projects from the wall edge portion. The spring beam includes first and second beam segments and an inflection area located between the first and second beam segments. The first beam segment extends from the wall edge portion to the inflection area and is angled toward the mating plug. The second beam segment extends away from the inflection area in a direction that is angled away from the mating plug.

20 Claims, 7 Drawing Sheets

PLUGGABLE CONNECTOR CONFIGURED TO REDUCE ELECTROMAGNETIC INTERFERENCE LEAKAGE

BACKGROUND

The subject matter herein relates generally to a pluggable connector that is configured to reduce electromagnetic interference (EMI) leakage.

Pluggable I/O assemblies are used to transfer data between different communication systems or devices. Pluggable I/O assemblies include a pluggable connector that is configured to be inserted into a port of a communication system. The pluggable connectors may be configured to transfer electrical signals or optical signals in accordance with certain standards. By way of example only, known communication or industry standards for pluggable I/O assemblies include small-form factor pluggable (SFP), enhanced SFP (SFP+), quad SFP (QSFP), C form-factor pluggable (CFP), and 10 Gigabit SFP, which is often referred to as XFP.

The communication system typically has a receptacle assembly that includes the port through which the pluggable connector is inserted. The receptacle assembly is mounted to a circuit board of the communication system. The port provides access to a receiving cavity of the receptacle assembly where a mating connector is located. The mating connector receives and engages the pluggable connector during a mating operation. Communication systems often include a panel (or bezel) having a panel passage that aligns with the port of the receptacle assembly.

There has been a general demand to increase data throughput in communication systems that utilize pluggable I/O assemblies. To meet this demand, industry suppliers have increased the density of receptacle assemblies in the communication system or have increased the data rate of the pluggable I/O assemblies. In either case, it may be more difficult to contain EMI emissions.

In one system, EMI emissions are contained, at least in part, by the receptacle assembly and an EMI skirt that surrounds a plug body of the pluggable connector. Both the plug body and the EMI skirt are inserted into the receiving cavity when the pluggable connector and receptacle assembly are mated. The EMI skirt includes spring fingers that are configured to engage the plug body. The spring fingers are also configured to engage the receptacle assembly as the pluggable connector is inserted into the receiving cavity.

The EMI skirt may be stamped from a planar section of sheet metal and formed to define a plurality of skirt walls. Each skirt wall is configured to extend adjacent to a planar side of the plug body. When the EMI skirt is shaped, however, the skirt walls may become non-planar such that the skirt walls are slightly curved and bow away from the plug body. In such instances, one or more of the spring fingers may not sufficiently engage the plug body when the pluggable connector and the receptacle assembly are mated. As a result, EMI may be permitted to radiate through the port of the communication system.

Accordingly, there is a need for a pluggable I/O assembly having an EMI skirt that provides a sufficient level of EMI containment.

BRIEF DESCRIPTION

In an embodiment, a pluggable connector is provided that includes a connector housing having a mating plug that is configured to be inserted into a receiving cavity of a communication system during a mating operation. The mating plug has an exterior surface. The pluggable connector also includes an electromagnetic interference (EMI) skirt that is coupled to the mating plug. The EMI skirt has a skirt wall that extends alongside the exterior surface of the mating plug. The skirt wall has a wall edge portion and a spring beam that projects from the wall edge portion. The spring beam includes first and second beam segments and an inflection area located between the first and second beam segments. The first beam segment extends from the wall edge portion to the inflection area in a direction that is angled toward the exterior surface. The second beam segment extends from the inflection area in a direction that is angled away from the mating plug. The second beam segment is configured to be deflected generally toward the exterior surface during the mating operation.

In some embodiments, the second beam segment may be configured to be deflected generally toward the mating plug during the mating operation. The spring beam may engage the exterior surface proximate to the inflection area after the mating operation. In some embodiments, the first beam segment may be deflected in a first direction when the EMI skirt is coupled to the mating plug. The second beam segment is configured to be deflected generally toward the mating plug in a second direction during the mating operation. The first and second directions are opposite directions.

In some embodiments, the skirt wall coincides with a wall plane that extends parallel to the exterior surface of the mating plug. The first beam segment forms a biasing angle with respect to the wall plane. The second beam segment forms a grounding angle with respect to the wall plane. The grounding angle has a value that is greater than a value of the biasing angle.

In some embodiments, the mating plug is an elongated mating plug having a front edge. The skirt wall extends to at least the front edge. Optionally, the skirt wall clears the front edge such that the EMI skirt is inserted into the receiving cavity of the communication system prior to the mating plug during the mating operation.

In an embodiment, a pluggable connector is provided that includes a connector housing having a mating plug that is configured to be inserted into a receiving cavity of a communication system during a mating operation. The mating plug has an exterior surface. The pluggable connector also includes an electromagnetic interference (EMI) skirt having a plurality of skirt walls that at least partially surround a plug passage. A central axis extends parallel to the skirt walls through the plug passage. At least one of the skirt walls has a wall edge portion and a spring beam that extends from the wall edge portion. The spring beam includes first and second beam segments and an inflection area located between the first and second beam segments. The first beam segment extends from the wall edge portion in a direction that is angled toward the central axis. The second beam segment extends from the inflection area in a direction that is angled away from the central axis.

In an embodiment, an electromagnetic interference (EMI) skirt configured to at least partially surround a mating plug is provided. The EMI skirt includes a plurality of skirt walls that at least partially surround a plug passage. A central axis extends parallel to the skirt walls through the plug passage. At least one of the skirt walls has a wall edge portion and a spring beam that extends from the wall edge portion. The spring beam includes first and second beam segments and an inflection area located between the first and second beam segments. The first beam segment extends from the wall edge portion in a direction that is angled toward the central axis. The second beam segment extends from the inflection area in a direction that is angled away from the central axis.

DETAILED DESCRIPTION

Figure 1:
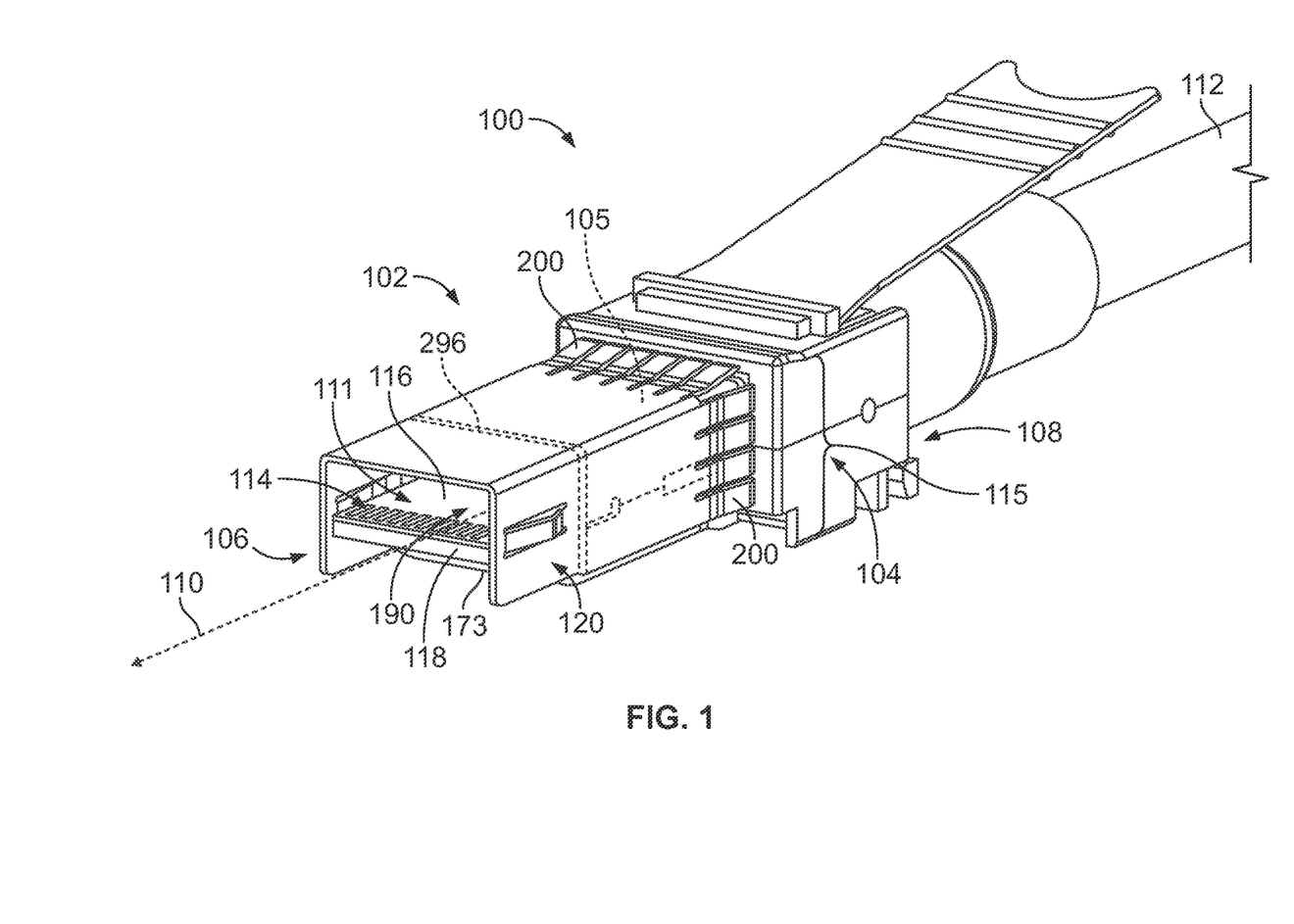
FIG. 1 is a perspective view of a pluggable input/output (I/O) assembly that includes a pluggable connector formed in accordance with an embodiment.

FIG. 1 is a perspective view of a pluggable input/output (I/O) assembly 100 formed in accordance with an embodiment. The pluggable I/O assembly 100 is configured to be inserted into a receptacle assembly 400 (shown in FIG. 11) and engage a mating connector 402 (shown in FIG. 11) within the receptacle assembly 400 during a mating operation. In some applications, the pluggable I/O assembly 100 may be referred to as a pluggable transceiver module. The pluggable I/O assembly 100 includes a pluggable connector 102 having a leading end 106 and a trailing end 108. As shown, a central axis 110 extends between the leading and trailing ends 106, 108.

The pluggable I/O assembly 100 may be configured for various applications. Non-limiting examples of such applications include host bus adapters (HBAs), redundant arrays of inexpensive disks (RAIDs), workstations, servers, storage racks, high performance computers, or switches. The pluggable I/O assembly 100 may be configured to be compliant with certain standards, such as, but not limited to, the small-form factor pluggable (SFP) standard, enhanced SFP (SFP+) standard, quad SFP (QSFP) standard, C form-factor pluggable (CFP) standard, and 10 Gigabit SFP standard, which is often referred to as the XFP standard. Embodiments may be capable of transmitting data at a rate of at least about four (4) gigabits per second (Gbps), at least about 10 Gbps, at least about 20 Gbps, at least about 40 Gbps, or more. Although the pluggable I/O assembly 100 may be a high-speed connector in some embodiments, the pluggable I/O assembly 100 may transmit at slower transmission speeds or data rates.

The pluggable I/O assembly 100 includes a communication cable 112 that is coupled to the pluggable connector 102 at the trailing end 108. The communication cable 112 is configured to transfer data signals to and/or from a contact array 114 of the pluggable connector 102 that is disposed proximate to the leading end 106. The communication cable 112 may be permanently attached to the pluggable connector 102 or separably attached to the pluggable connector 102. In an exemplary embodiment, the communication cable 112 transmits electrical data signals. In other embodiments, the communication cable 112 may include one or more optical fibers that are configured to transfer optical data signals to the pluggable connector 102 and/or from the pluggable connector 102. In such embodiments, the pluggable connector 102 may include an optical engine (not shown) that converts the data signals between optical signals and electrical signals.

Figures 11, 12:
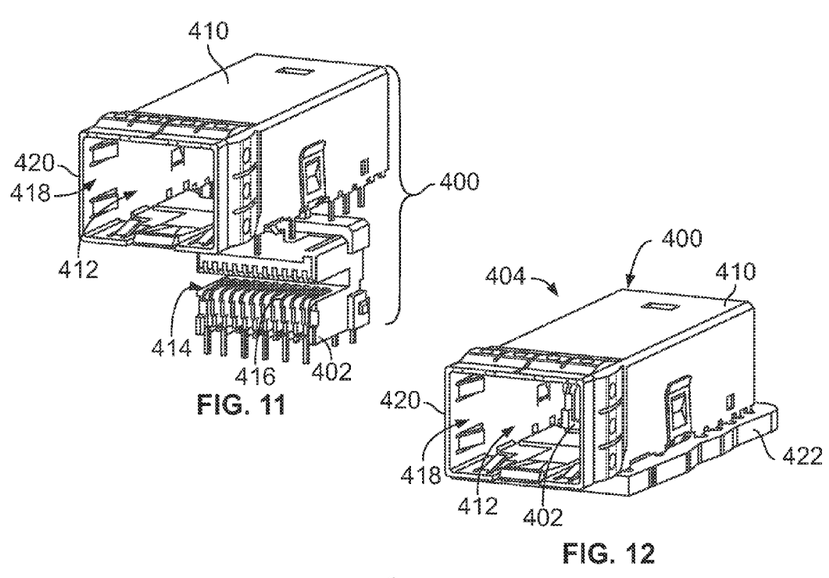
FIG. 11 is an exploded view of a receptacle assembly that may be used with various embodiments.
FIG. 12 is a perspective view of a communication system that includes the receptacle assembly mounted to a circuit board.

The pluggable connector 102 includes a connector housing 104 and an electromagnetic interference (EMI) skirt 120 that is coupled to the connector housing 104. The connector housing 104 includes a connector base 115 and a mating plug 105 that extends from the connector base 115 along the central axis 110. In FIG. 1, the mating plug 105 is received within a plug passage 190 of the EMI skirt 120. Accordingly, the mating plug 105 is indicated in phantom. The mating plug 105 represents the portion of the connector housing 104 that is inserted into the receptacle assembly 400 (FIG. 11). The connector base 115 represents a portion of the connector housing 104 that is not inserted into the receptacle assembly 400.

The EMI skirt 120 includes spring beams 200 that are positioned adjacent to the mating plug 105 and proximate to the connector base 115. In other embodiments, the spring beams 200 may be positioned away from the connector base 115. As set forth herein, the spring beams 200 are configured to directly engage the mating plug 105 and the communication system 404 (FIG. 12) to establish a ground pathway between the pluggable connector 102 and the communication system 404.

The pluggable connector 102 includes internal circuitry 111 that generates electromagnetic interference (EMI) emissions during operation of the pluggable connector 102. More specifically, electrical current in the form of data signals or electrical power may generate the EMI emissions during operation of the pluggable connector 102. In the illustrated embodiment, the internal circuitry 111 may include a circuit board 116 that has the contact array 114 along a front edge 118 of the circuit board 116. The connector housing 104 is configured to surround at least a portion of the internal circuitry 111 to contain the EMI emissions generated by the internal circuitry 111. The connector housing 104 may be conductive and may surround the internal circuitry 111 about the central axis 110. The EMI skirt 120 surrounds the mating plug 105 and is also configured to contain the EMI emissions generated by the internal circuitry 111.

Figure 2:
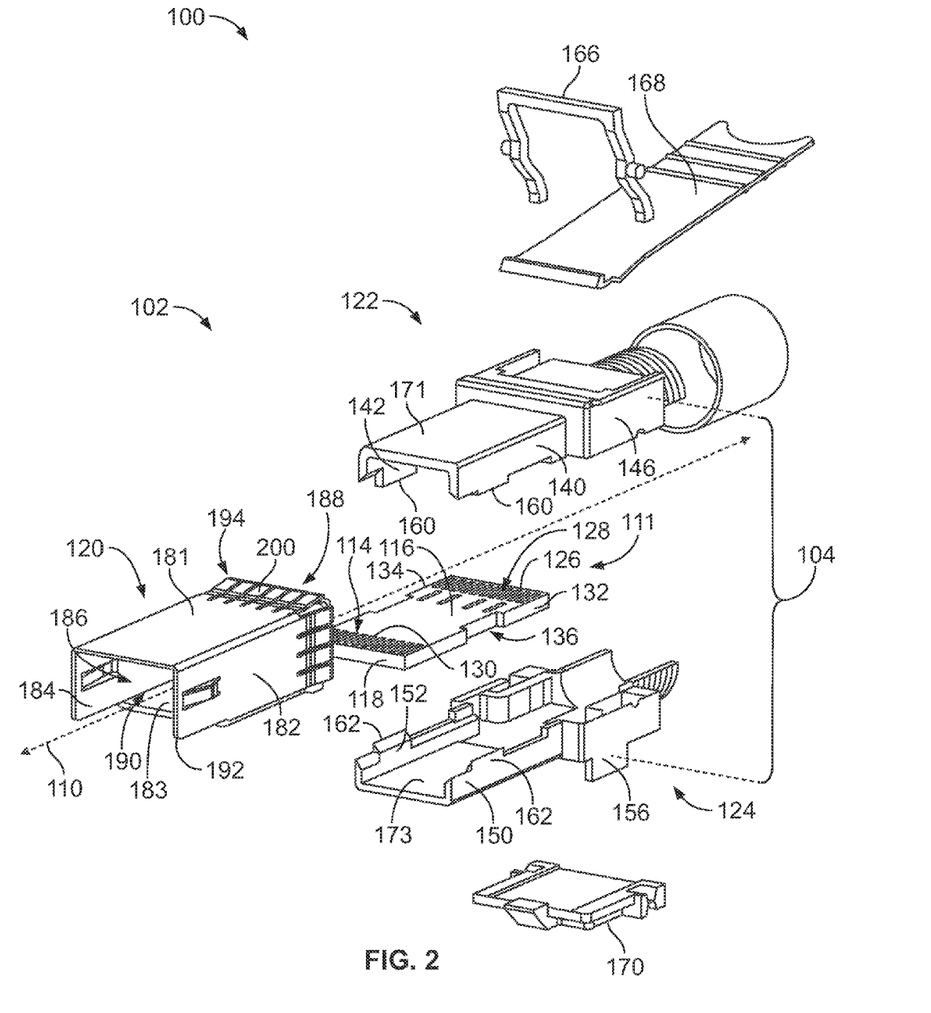
FIG. 2 is an exploded view of the pluggable connector that may be used with the pluggable I/O assembly of FIG. 1.

FIG. 2 is an exploded view of the pluggable I/O assembly 100. In the illustrated embodiment, the connector housing 104 is formed from a pair of housing shells 122, 124. In an exemplary embodiment, each of the housing shells 122, 124 defines a portion of the connector base 115 (FIG. 1) and a portion of the mating plug 105 (FIG. 1). The housing shells 122, 124 may be molded from a conductive material, such as a polymer with embedded conductive fibers. In other embodiments, the connector housing 104 or the housing shells 122, 124 may include an exterior and/or interior conductive plating.

The circuit board 116 includes a back edge 126 that also includes a contact array 128. The back edge 126 and the front edge 118 face in opposite directions. The contact arrays 114, 128 are communicatively coupled to each other through traces (not shown) of the circuit board 116. Each of the contact arrays 114, 128 includes a plurality of electrical contacts 130, which may be contact pads in some embodiments. The circuit board 116 also includes a pair of side edges 132, 134 that face in opposite directions. Each of the side edges 132, 134 forms a corresponding recess 136.

Figure 7:
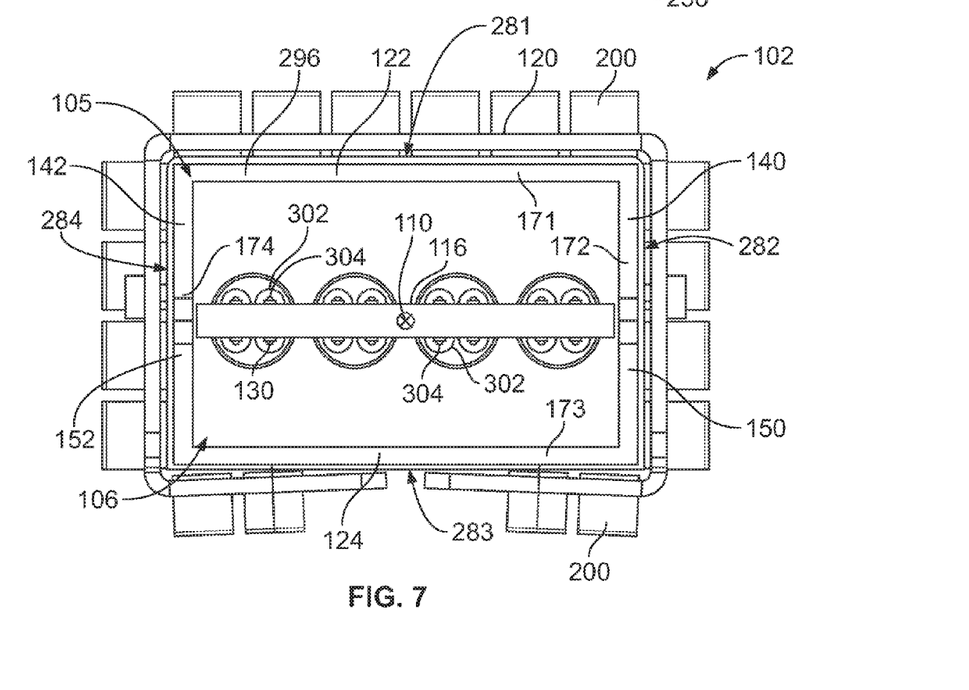
FIG. 7 is an end view of the pluggable connector of FIG. 1.

In an exemplary embodiment, the communication cable 112 (FIG. 1) includes a plurality of insulated wires 302 (shown in FIG. 7) that are stripped to expose conductors 304 (shown in FIG. 7). The exposed conductors 304 are terminated to the electrical contacts 130 of the contact array 128. Although not shown, the circuit board 116 may include one or more processing units attached thereto that modify the data signals during operation. In some embodiments, the circuit board 116, the processing unit(s), the exposed conductors 304, and the communication cable 112 may collectively form the internal circuitry 111 of the pluggable connector 102 that generates EMI emissions.

When the pluggable connector 102 is assembled, the circuit board 116 is positioned between the housing shells 122, 124 and the housing shells 122, 124 are joined to each other. The housing shell 122 includes side portions 140, 142 and a plug side 171 that extends between and joins the side portions 140, 142. The housing shell 122 includes a base portion 146. The plug side 171 and the side portions 140, 142 project from the base portion 146 along the central axis 110. Similarly, the housing shell 124 includes side portions 150, 152 and a plug side 173 that extends between and joins the side portions 150, 152. The housing shell 124 includes a base portion 156. The plug side 173 and the side portions 150, 152 project from the base portion 156 along the central axis 110.

The housing shells 122, 124 form the connector housing 104 when joined together with the circuit board 116 therebetween. In the illustrated embodiment, the plug sides 171, 173 and the side portions 140, 142, 150, 152 collectively form the mating plug 105 (FIG. 1). The base portions 146, 156 combine to form the connector base 115 (FIG. 1). The circuit board 116 may be held at a designated position between the housing shells 122, 124. For example, each of the side portions 140, 142 includes a board projection 160, and each of the side portions 150, 152 includes a board projection 162. When the housing shells 122, 124 are joined, each of the recesses 136 of the circuit board 116 receives one of the board projections 160 and one of the board projections 162. The board projections 160, 162 may operate as positive stops that block the circuit board 116 from moving along the central axis 110.

The EMI skirt 120 includes a plurality of skirt walls 181, 182, 183, 184 that define a connector-receiving opening 186 and a plug-receiving opening 188. The plug passage 190 extends between the connector-receiving and plug-receiving openings 186, 188. the skirt walls 181-184 extend parallel to the central axis 110 between the connector-receiving and plug-receiving openings 186, 188. The skirt walls 181, 182, 184 define a front edge 192 of the EMI skirt 120 that is configured to be inserted into the receptacle assembly 400 (FIG. 11) before the circuit board 116. The skirt walls 181-184 define a back portion 194 of the EMI skirt 120 that includes the spring beams 200. The spring beams 200 surround the central axis 110. When the pluggable connector 102 is assembled, the mating plug 105 (FIG. 1) is inserted through the plug-receiving opening 188. As described herein, the spring beams 200 are configured to engage the mating plug 105 and also engage the receptacle assembly 400.

Also shown in FIG. 2, the pluggable I/O assembly 100 may include a release mechanism that includes a lever 166, a pull tab 168, and an actuator 170. The lever 166 is configured to couple to the pull tab 168 and engage the actuator 170. When the pluggable I/O assembly 100 is mated with the receptacle assembly 400, the pull tab 168 may be pulled away from the connector base 115 to rotate the lever 166 and activate the actuator 170. The actuator 170 may move to dislodge the pluggable connector 102 from the receptacle assembly 400.

Figure 3:
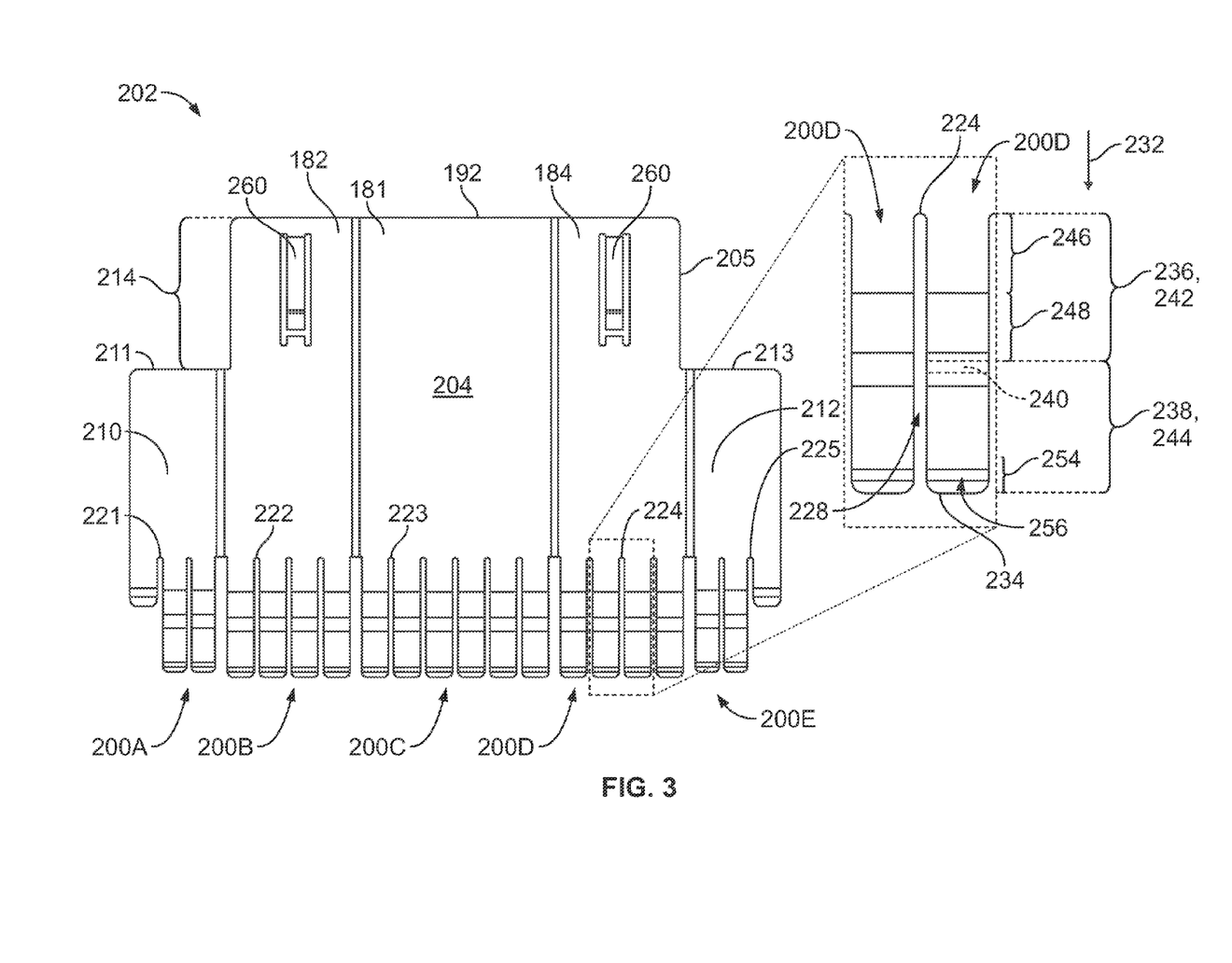
FIG. 3 is a plan view of a blank of material that may be used to form an electromagnetic interference (EMI) skirt in accordance with an embodiment.

FIG. 3 is a plan view of a skirt blank 202. In an exemplary embodiment, the EMI skirt 120 (FIG. 1) is stamped from sheet metal to provide the skirt blank 202 and then shaped or formed to provide the EMI skirt 120. The skirt blank 202 includes a first blank surface 204 and a second blank surface 206 (shown in FIG. 5) that is opposite the first blank surface 204. In the illustrated embodiment, the first blank surface 204 becomes an exterior surface of the EMI skirt 120, and the second blank surface 206 becomes an interior surface of the EMI skirt 120. When the skirt blank 202 is stamped, a stamped edge 205 is formed that defines a perimeter or profile of the skirt blank 202. Although the EMI skirt 120 is stamped and formed from sheet metal in the exemplary embodiment, the EMI skirt 120 may formed in other manners, such as molding or 3D printing.

In the illustrated embodiment, the skirt blank 202 includes the skirt walls 181, 182, and 184 and also first and second wall sections 210, 212. When the EMI skirt 120 is shaped, the first and second wall sections 210, 212 are positioned such that the first and second wall sections 210, 212 are coplanar and form the skirt wall 183 (FIG. 2). As shown, the skirt walls 181, 182, 184 collectively form the front edge 192, and the first and second wall sections 210, 212 include forward-facing edges 211, 213, respectively. The forward-facing edges 211, 213 may be located a distance or depth 214 away from the front edge 192.

The skirt walls 182, 181, 184, include wall edge portions 222, 223, 224, respectively, and the first and second wall sections 210, 212 include wall edge portions 221, 225, respectively. The skirt walls 182, 181, 184 include spring beams 200B, 200C, 200D, respectively, that project from the wall edge portions 222, 223, 224, respectively. The wall section 210, 212 include spring beams 200A, 200E, respectively, that project from the wall edge portions 221, 225, respectively. The wall edge portions 221-225 are portions of the stamped edge 205 and may extend generally transverse to the central axis 110 (FIG. 1). Also shown, each of the skirt walls 182, 184 may optionally include a receptacle-engaging finger 260.

FIG. 3 shows an enlarged view of adjacent spring beams 200D in which the spring beams 200D extend in a beam direction 232 from the wall edge portion 224. The adjacent spring beams 200D are separated by a slit 228. Although the following is with specific reference to one of the spring beams 200D, it is understood that the other spring beams 200D and the other spring beams 200A, 200B, 200C and 200E may include similar or identical features.

The spring beam 200D includes a plurality of beam segments that define a shape of the spring beam 200D. Different beam segments may extend in different directions with respect to other beam segments. For example, after the EMI skirt 120 (FIG. 1) is shaped for receiving the mating plug 105 (FIG. 1), the spring beam 200D includes a first or proximal beam segment 236 and a second or distal beam segment 238. The spring beam 200D also includes an inflection area 240 located between the first and second beam segments 236, 238. The first beam segment 236 has a length 242, and the second beam segment 238 has a length 244. In an exemplary embodiment, the length 244 of the second beam segment 238 is substantially equal to or slightly shorter than the length 242 of the first beam segment 236.

Also shown in the enlarged view of FIG. 3, the first beam segment 236 includes a wall or base portion 246 that extends from the wall edge portion 224 and a plug-engaging portion 248 that extends from the wall portion 246 to the inflection area 240 or the second beam segment 238. The second beam segment 238 has a grounding portion 254 that includes a distal tip 234 of the spring beam 200D and an inflection area 256. The inflection area 256 is configured to engage the receptacle assembly 400 (FIG. 11). The inflection area 256 is on the first blank surface 204, and the inflection area 240 is on the second blank surface 206.

Figure 4:
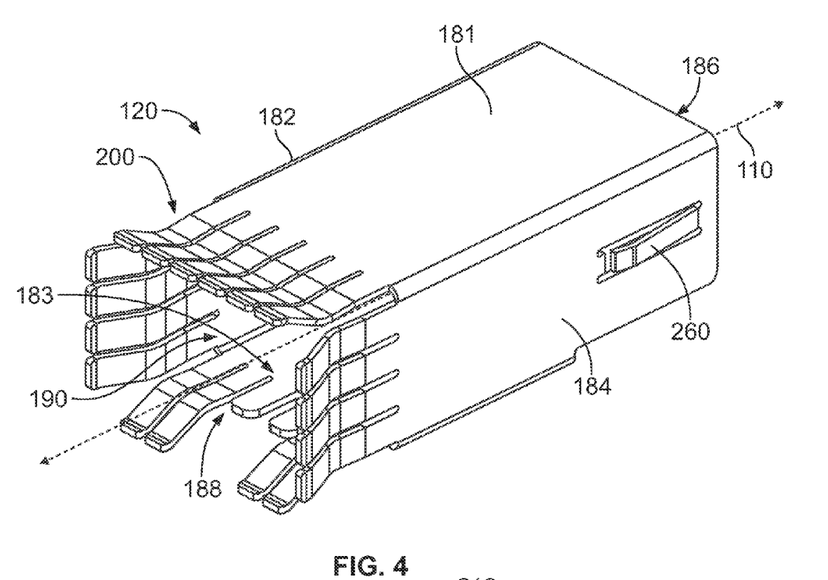
FIG. 4 is a top perspective view of the EMI skirt formed from the blank of FIG. 3.
Figure 5:
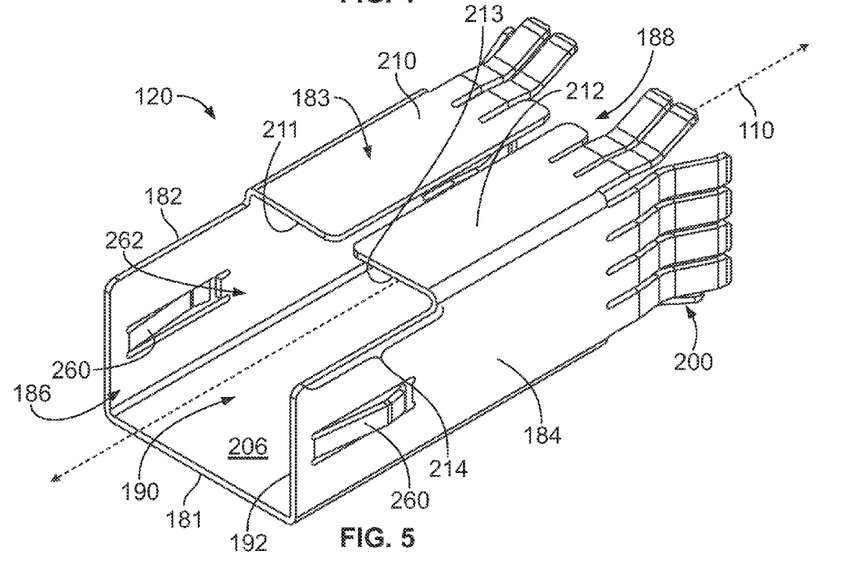
FIG. 5 is a bottom perspective view of the EMI skirt formed from the blank of FIG. 3.

FIG. 4 is a top perspective view of the EMI skirt 120, and FIG. 5 is a bottom perspective view of the EMI skirt 120. The skirt walls 181-184 define the plug passage 190, which extends between the connector-receiving opening 186 and the plug-receiving opening 188. The spring beams 200 may circumferentially surround the plug-receiving opening 188 about the central axis 110. In the illustrated embodiment, the spring beams 200 are substantially evenly distributed along each of the skirt walls 181, 182, 184, but not the skirt wall 183. In other embodiments, the spring beams 200 may not be evenly distributed and/or at least one of the skirt walls 181-184 may not include the spring beams 200.

As shown in FIGS. 4 and 5, the receptacle-engaging fingers 260 are shaped to extend outwardly away from the plug passage 190 or the central axis 110 when the EMI skirt 120 is formed. During the mating operation, the receptacle assembly 400 (FIG. 11) deflects the receptacle-engaging fingers 260 inward thereby permitting the pluggable connector 102 (FIG. 1) to be inserted into the receptacle assembly 400. The receptacle assembly 400 may include holes or recesses (not shown). When the receptacle-engaging fingers 260 clear the holes, the receptacle-engaging fingers 260 may flex outward into the holes and engage a portion of the receptacle assembly 400.

As shown in FIG. 5, the wall sections 210, 212 are substantially coplanar and form the skirt wall 183. The forward-facing edges 211, 213 are located the distance 214 from the front edge 192 to define a mating space 262. The mating space 262 is sized and shaped to receive the mating connector 402 (FIG. 11). When the pluggable connector 102 (FIG. 1) is fully mated with the receptacle assembly 400 (FIG. 11), the mating connector 402 may be disposed within the mating space 262 and the forward-facing edges 211, 213 may engage or directly face the mating connector 402.

Figure 6:
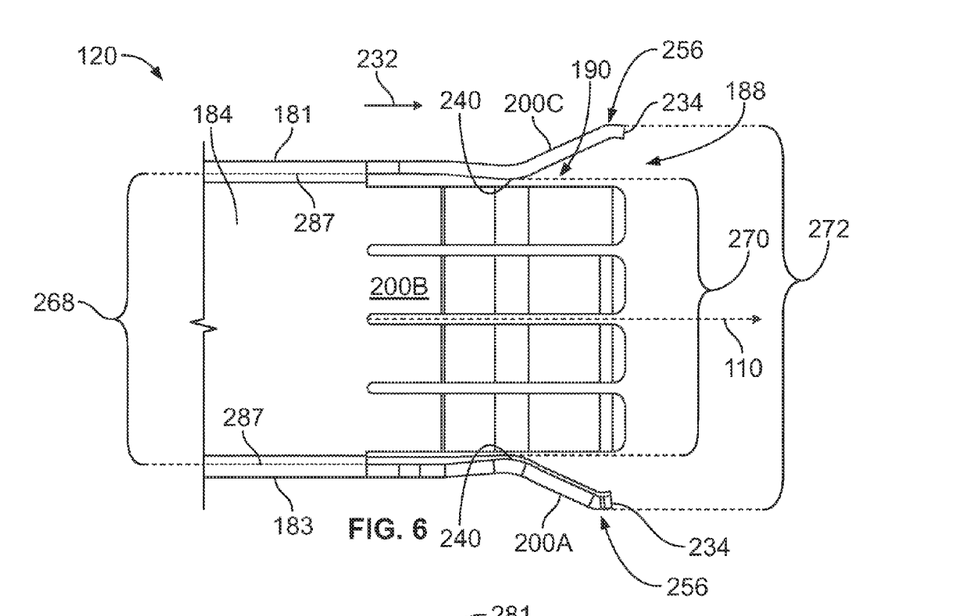
FIG. 6 is a side view of a portion of the EMI skirt formed from the blank of FIG. 3.

FIG. 6 is a side view of a portion of the EMI skirt 120 and illustrates different passage dimensions of the EMI skirt 120. As shown, the skirt walls 181, 183 may have a wall-to-wall dimension 268 that is measured between corresponding interior surfaces 287 of the skirt walls 181, 183 and transverse to the central axis 110. The wall-to-wall dimension 268 is sized relative to the mating plug 105 (FIG. 1) such that the mating plug 105 is permitted to be inserted through and slidably engage the skirt walls 181, 183. The spring beams 200C, 200A are shaped to define a beam-to-beam dimension 270 and an outer dimension 272 that are measured transverse to the central axis 110.

The beam-to-beam dimension 270 and the outer dimension 272 are configured so that the spring beams 200C, 200A may engage both the mating plug 105 and the receptacle assembly 400 (FIG. 11). For instance, the spring beams 200C, 200A initially extend from the corresponding skirt walls 181, 183 in respective directions that are angled toward the central axis 110. In an exemplary embodiment, the beam-to-beam dimension 270 is measured between an inflection area 240 of the spring beam 200C and an inflection area 240 of the spring beam 200A that substantially opposes the spring beam 200C across the plug passage 190. The beam-to-beam dimension 270 is less than the wall-to-wall dimension 268.

As the spring beams 200C, 200A extend in the beam direction 232 from the corresponding inflection areas 240, the spring beams 200C, 200A are angled away from each other. The outer dimension 272 is measured between the inflection area 256 of the spring beam 200C and the inflection area 256 of the spring beam 200A that substantially opposes the spring beam 200C. The outer dimension 272 is greater than the wall-to-wall dimension 268. The spring beams 200C, 200A may spread or flare outward with respect to the central axis 110 to increase a size of the plug-receiving opening 188. Although the aforementioned passage dimensions were described as being between the skirt walls 181, 183, the skirt walls 182 (FIG. 2) and 184 may have passage dimensions therebetween that vary in a similar manner as described above with respect to the skirt walls 181, 183.

FIG. 7 is a view of the leading end 106 of the pluggable connector 102 prior to the mating operation. For illustrative purposes, the connector base 115 (FIG. 1) is not shown in FIG. 7. The wire conductors 304 of the insulated wires 302 are terminated to corresponding electrical contacts 130 on both sides of the circuit board 116. Also shown, the plug sides 171, 173 are opposite each other and form first and third plug sides 171, 173. The side portions 140, 150 of the housing shells 122, 124, respectively, form a second plug side 172. The side portions 142, 152 form a fourth plug side 174 that is opposite the second plug side 172. The plug sides 171-174 include respective exterior surfaces 281, 282, 283, 284.

Figure 13:
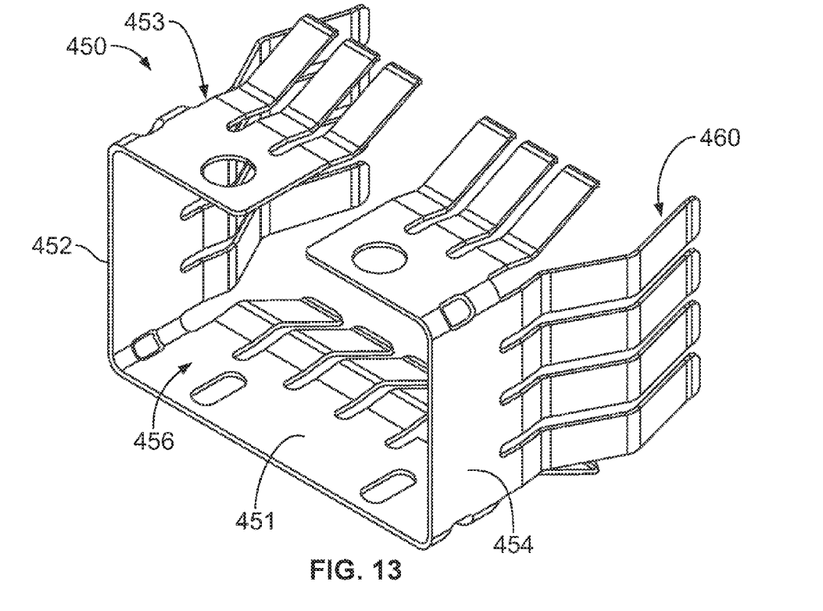
FIG. 13 is a perspective view of an EMI skirt formed in accordance with an embodiment.

The plug sides 171-174 may collectively define a front edge 296 of the mating plug 105. With brief reference to FIG. 1, the EMI skirt 120 may extend substantially from the connector base 115 to at least the front edge 296. In the illustrated embodiment, the EMI skirt 120 clears the front edge 296 such that the EMI skirt 120 is inserted into the receiving cavity 412 (FIG. 11) before the mating plug 105. In other embodiments, the EMI skirt 120 may not clear the front edge 296. For example, FIG. 13 illustrates an EMI skirt 450 that may not clear a front edge of the mating plug (not shown).

Returning to FIG. 7, the EMI skirt 120 surrounds the mating plug 105 about the central axis 110. In particular embodiments, the EMI skirt 120 surrounds nearly an entirety of the mating plug 105 about the central axis 110. In other embodiments, the EMI skirt 120 only partially surrounds the mating plug 105. The EMI skirt 120 may engage each of the exterior surfaces 281-284. More specifically, the spring beams 200 of the EMI skirt 120 surround the mating plug 105 and engage corresponding exterior surfaces 281-284. Accordingly, the spring beams 200 are configured to engage the mating plug 105 prior to the mating operation.

Figure 8:
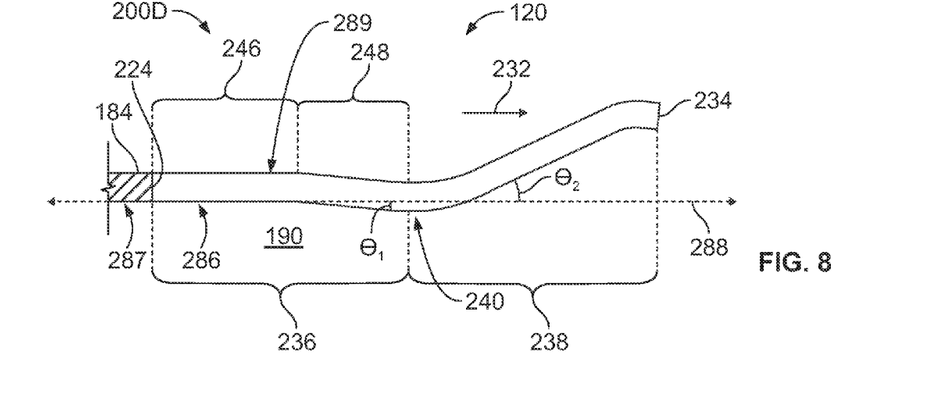
FIG. 8 is a side view of a spring beam of the EMI skirt when the spring beam is in a relaxed condition.
Figure 9:
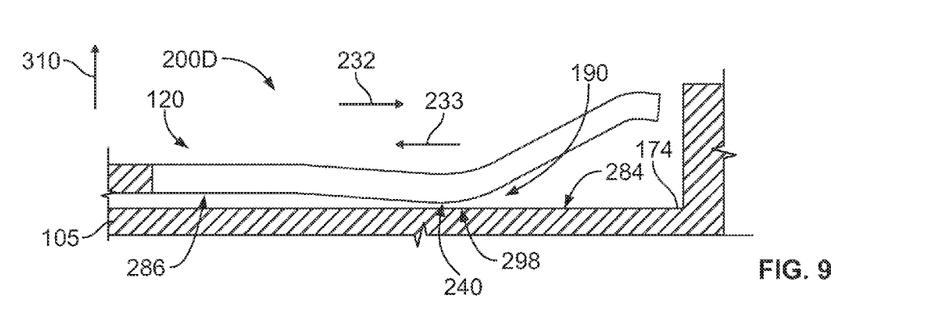
FIG. 9 is a side view of the spring beam of FIG. 8 when the spring beam is deflected outward by a mating plug of the pluggable connector.
Figure 10:
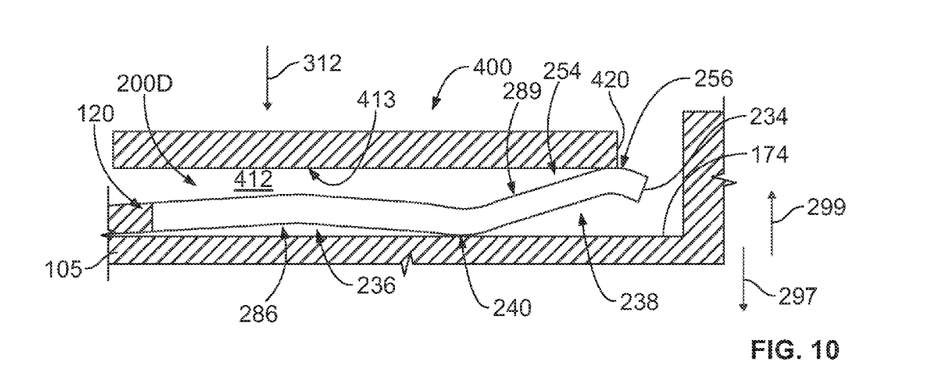
FIG. 10 is a side view of the spring beam when the spring beam is deflected both outward by the mating plug and inward by a receptacle assembly.

FIGS. 8-10 illustrate different conditions of an exemplary spring beam 200D. Although the following is with specific reference to the spring beam 200D of the skirt wall 184, the skirt walls 181-183 (FIG. 2) may include similar or identical spring beams. FIG. 8 shows the spring beam 200D in a relaxed condition. The interior surface 287 of the skirt wall 184 extends along or coincides with a wall plane 288 that may extend parallel to the central axis 110 (FIG. 6) and the exterior surface 284 (FIG. 7) of the mating plug 105 (FIG. 1).

The first beam segment 236 extends from the wall edge portion 224 to the inflection area 240 in a direction that is angled toward the central axis 110 (or the exterior surface 284 of the mating plug 105 after the mating plug 105 is inserted within the EMI skirt 120). Collectively, the first beam segments 236 may converge toward the central axis 110. The second beam segment 238 extends from the inflection area 240 to the distal tip 234 in a direction that is angled away from the central axis 110 (or the exterior surface 284 of the mating plug 105 after the mating plug 105 is inserted within the EMI skirt 120). Collectively, the second beam segments 238 may diverge away from the central axis 110. As shown, the wall portion 246 extends parallel to the central axis 110 in the beam direction 232. The plug-engaging portion 248, however, is angled with respect to the wall portion 246 such that the plug-engaging portion 248 extends from the wall portion 246 into the plug passage 190 and toward the central axis 110 (shown in FIG. 6). The second beam segment 238 is shaped to extend from the plug-engaging portion 248 in a direction that is angled away from the plug passage 190 and the central axis 110.

The spring beam 200D has an inner beam surface 286 that is formed from the blank surface 206 (FIG. 5) and an outer beam surface 289 that is formed from the blank surface 204 (FIG. 3). The inflection area 240 may represent a localized area of the spring beam 200D along the inner beam surface 286 that is closest to the central axis 110. The inner beam surface 286 coincides with the wall plane 288 along the wall portion 246. The plug-engaging portion 248, however, is angled with respect to the wall portion 246 such that the inner beam surface 286 along the plug-engaging portion 248 extends below the wall plane 288. The spring beam 200D is shaped to redirect the spring beam 200D at the inflection area 240 such that the inner beam surface 286 clears and extends away from the wall plane 288.

In the relaxed condition, the spring beam 200D may form a biasing angle $\theta_1$ that is measured between the wall plane 288 and the inner beam surface 286 along the plug-engaging portion 248. The spring beam 200D may also form a grounding angle $\theta_2$ that is measured between the wall plane 288 and the inner beam surface 286 along the second beam segment 238. In an exemplary embodiment, a value of the grounding angle $\theta_2$ is greater than a value of the biasing angle $\theta_1$. More specifically, without considering the directions of the biasing and grounding angles $\theta_1$, $\theta_2$, the value of the grounding angle $\theta_2$ is greater than the value of the biasing angle $\theta_1$. For example, a range of values for the biasing angle $\theta_1$ may be about 3° to about 5° when the spring beam 200D is in the relaxed condition, and a range of values for the grounding angle $\theta_2$ may be about 8° to about 15° when the spring beam 200D is in the relaxed condition.

FIG. 9 shows the spring beam 200D engaged to the mating plug 105 of the pluggable connector 102 (FIG. 1). To couple the EMI skirt 120 to the mating plug 105, the mating plug 105 may be moved into the plug passage 190 in an insert direction 233 along the central axis 110 (FIG. 1) that is opposite the beam direction 232. In some embodiments, the front edge 296 (FIG. 1 or FIG. 7) may engage and deflect the spring beam 200D in a first direction 310. The spring beam 200D may directly engage the plug side 174 at the inflection area 240 and slide therealong. In such embodiments, the mating plug 105 may deflect the spring beam 200D such that the spring beam 200D moves generally away from the central axis 110 (FIG. 1) or the plug passage 190 (FIG. 1). In other embodiments, however, the mating plug 105 may not directly engage the spring beams 200D at the inflection area 240 prior to the mating operation with the receptacle assembly 400 (FIG. 10). For example, as shown in FIG. 9, the inflection area 240 may be separated from the plug side 174 with a small or nominal gap 298 therebetween.

FIG. 10 shows the spring beam 200D engaged to the mating plug 105 along the inner beam surface 286 and engaged to the receptacle assembly 400 along the outer beam surface 289. The second beam segment 238 has the grounding portion 254. The grounding portion 254 includes the distal tip 234 and is configured to engage the receptacle assembly 400. The grounding portion 254 has a curved contour that forms the inflection area 256. As the EMI skirt 120 and the mating plug 105 are inserted into the receiving cavity 412, the grounding portion 254 may engage a mating edge 420 of the receptacle assembly 400 and/or an interior surface 413 of the receptacle assembly 400. The spring beam 200D is deflected generally toward the plug side 174 or the central axis 110 (FIG. 1) in a second direction 312 that is opposite the first direction 310 (FIG. 9). For embodiments in which the small or nominal gap 298 (FIG. 9) exists between the exterior surface 284 of the plug side 174 and the inflection area 240 prior to the mating operation, both the first beam segment 236 and the second beam segment 238 are deflected in the second direction 312 until the inflection area 240 engages the plug side 174. For embodiments in which the inflection area 240 directly engages the plug side 174 prior to the mating operation, only the second beam segment 238 may be deflected in the second direction 312 toward the plug side 174.

Accordingly, the spring beam 200D engages the mating plug 105 and the receptacle assembly 400 at the inflection areas 240, 256, respectively, after the mating operation. As shown, the spring beam 200D may exert a contact force 297 (indicated by an arrow) against the exterior surface 284 at the inflection area 240 when the spring beam 200D is deflected. The second beam segment 238 of the spring beam 200D may also exert a contact force 299 (indicated by an arrow) against the receptacle assembly 400 proximate to the inflection area 256. As shown, the contact forces 297, 299 are in opposite directions.

The contact forces 297, 299 may operate to maintain a conductive pathway between the mating plug 105 and the receptacle assembly 400 throughout operation of the pluggable connector 102 (FIG. 1). Collectively, the multiple conductive pathways formed by the spring beams 200 may reduce EMI leakage through the communication system 404 (FIG. 12).

FIG. 11 is an exploded view of the receptacle assembly 400, and FIG. 12 is a perspective view of a communication system 404 that includes the receptacle assembly 400. The receptacle assembly 400 includes a receptacle cage 410 that defines the receiving cavity 412 and the mating connector 402 that is disposed within the receiving cavity 412. The mating connector 402 has an edge slot 414 (FIG. 11) that is sized and shaped to receive the front edge 118 (FIG. 1) of the circuit board 116 (FIG. 1). The mating connector 402 includes electrical contacts 416 (FIG. 11) that are positioned within the edge slot 414 and configured to engage the electrical contacts 130 (FIG. 2) along the front edge 118 of the circuit board 116.

The receptacle cage 410 has the mating edge 420 that defines a port or opening 418 that provides access to the receiving cavity 412. The mating edge 420 may engage the spring beams 200 (FIG. 1) of the EMI skirt 120 (FIG. 1) during the mating operation. As shown in FIG. 12, the communication system 404 includes a circuit board 422. The receptacle assembly 400 is mounted to and electrically grounded to the circuit board 422. Although not shown, the communication system 404 may also include a panel or bezel having an opening that aligns with the port 418.

FIG. 13 is a perspective view of an EMI skirt 450 formed in accordance with an embodiment. The EMI skirt 450 may include similar or identical features and elements as the EMI skirt 120 (FIG. 1). For example, the EMI skirt 450 includes a plurality of skirt walls 451, 452, 453, 454 that are configured to surround a mating plug (not shown), such as the mating plug 105. The skirt walls 451-454 define a plug passage 456 that is configured to receive the mating plug. The EMI skirt

450 also includes spring beams 460 that may be similar or identical to the spring beams 200 (FIG. 1). Compared to the EMI skirt 120, the EMI skirt 450 may have a shorter length. In an exemplary embodiment, the EMI skirt 450 is stamped and formed from a blank of material that is similar to the skirt blank 202 (FIG. 3). However, the blank of material may be shorter than the skirt blank 202.

It is to be understood that the above description is intended to be illustrative, and not restrictive. For example, the EMI skirt 120 and the EMI skirt 450 each have a plurality of skirt walls that each have a plurality of spring beams. In other embodiments, EMI skirts may have only one skirt wall, and/or the EMI skirts may have only one spring beam along the corresponding skirt wall. Moreover, the above-described embodiments (and/or aspects thereof) may be used in combination with each other.

In addition, many modifications may be made to adapt a particular situation or material to the teachings of the various embodiments without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The patentable scope should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112(f), unless and until such claim limitations expressly use the phrase "means for" followed by a statement of function void of further structure.

What is claimed is:

1. A pluggable connector comprising:
a connector housing having a mating plug that is configured to be inserted into a receiving cavity of a communication system during a mating operation, the mating plug having an exterior surface; and
an electromagnetic interference (EMI) skirt coupled to the mating plug, the EMI skirt having a skirt wall that extends alongside the exterior surface of the mating plug, the skirt wall having a wall edge portion and a spring beam that projects from the wall edge portion, the spring beam including first and second beam segments and an inflection area located between the first and second beam segments, the first beam segment extending from the wall edge portion to the inflection area in a direction that is angled toward the exterior surface, the second beam segment extending from the inflection area in a direction that is angled away from the mating plug, the second beam segment configured to be deflected generally toward the exterior surface during the mating operation.

2. The pluggable connector of claim 1, wherein the second beam segment is configured to be deflected generally toward the mating plug during the mating operation, the spring beam engaging the exterior surface proximate to the inflection area after the mating operation.

3. The pluggable connector of claim 1, wherein the skirt wall coincides with a wall plane that extends parallel to the exterior surface of the mating plug, the first beam segment forming a biasing angle with respect to the wall plane, the second beam segment forming a grounding angle with respect to the wall plane, the grounding angle having a value that is greater than a value of the biasing angle.

4. The pluggable connector of claim 1, wherein the mating plug is an elongated mating plug having a front edge, the skirt wall extending to at least the front edge.

5. The pluggable connector of claim 4, wherein the skirt wall clears the front edge such that the EMI skirt is inserted into the receiving cavity of the communication system prior to the mating plug during the mating operation.

6. The pluggable connector of claim 1, wherein the EMI skirt includes a plurality of the skirt walls, the skirt walls forming a plug passage that receives the mating plug.

7. The pluggable connector of claim 1, wherein the inflection area is a first inflection area and the second beam segment includes a grounding portion, the grounding portion having a curved contour that forms a second inflection area, the grounding portion configured to engage the communication system at the second inflection area during the mating operation.

8. The pluggable connector of claim 1, further comprising a communication cable that is coupled to the pluggable connector.

9. A pluggable connector comprising:
a connector housing having a mating plug that is configured to be inserted into a receiving cavity of a communication system during a mating operation, the mating plug having an exterior surface; and
an electromagnetic interference (EMI) skirt having a plurality of skirt walls that at least partially surround a plug passage, wherein a central axis extends parallel to the skirt walls through the plug passage, at least one of the skirt walls having a wall edge portion and a spring beam that extends from the wall edge portion, the spring beam including first and second beam segments and an inflection area located between the first and second beam segments, the first beam segment extending from the wall edge portion in a direction that is angled toward the central axis, the second beam segment extending from the inflection area in a direction that is angled away from the central axis.

10. The pluggable connector of claim 9, wherein the second beam segment is configured to be deflected generally toward the central axis during the mating operation, the spring beam engaging the exterior surface proximate to the inflection area after the mating operation.

11. The pluggable connector of claim 9, wherein the at least one skirt wall coincides with a wall plane, the first beam segment forming a biasing angle with respect to the wall plane, the second beam segment forming a grounding angle with respect to the wall plane, the grounding angle having a value that is greater than a value of the biasing angle.

12. The pluggable connector of claim 9, wherein the inflection area is a first inflection area and the second beam segment includes a grounding portion, the grounding portion having a curved contour that forms a second inflection area, the grounding portion configured to engage the communication system at the second inflection area during the mating operation.

13. The pluggable connector of claim 9, wherein the EMI skirt is configured to surround nearly an entirety of the mating plug about the central axis.

14. The pluggable connector of claim 9, further comprising a communication cable that is coupled to the pluggable connector.

15. An electromagnetic interference (EMI) skirt configured to at least partially surround a mating plug, the EMI skirt having a plurality of skirt walls that at least partially surround a plug passage, wherein a central axis extends parallel to the skirt walls through the plug passage, at least one of the skirt walls having a wall edge portion and a spring beam that extends from the wall edge portion, the spring beam including first and second beam segments and an inflection area located between the first and second beam segments, the first beam segment extending from the wall edge portion in a direction that is angled toward the central axis, the second beam segment extending from the inflection area in a direction that is angled away from the central axis.

16. The EMI skirt of claim 15, wherein the at least one skirt wall coincides with a wall plane, the first beam segment forming a biasing angle with respect to the wall plane, the second beam segment forming a grounding angle with respect to the wall plane, the grounding angle having a value that is greater than a value of the biasing angle.

17. The EMI skirt of claim 15, wherein the second beam segment is configured to be deflected generally toward the central axis.

18. The EMI skirt of claim 15, wherein the inflection area is a first inflection area and the second beam segment forms a second inflection area, the spring beam having opposite inner and outer beam surfaces, the inner beam surface including the first inflection area, the outer beam surface including the second inflection area.

19. The EMI skirt of claim 15, wherein the spring beam extends from the wall edge portion in a beam direction, the EMI skirt being configured to receive the mating plug moving in an insert direction that is substantially opposite the beam direction.

20. The EMI skirt of claim 15, wherein the EMI skirt is configured to surround nearly an entirety of the mating plug.

* * * * *